(12) United States Patent
Chen

(10) Patent No.: US 7,672,419 B2
(45) Date of Patent: Mar. 2, 2010

(54) PRE-CHARGE CIRCUIT AND SHIFT REGISTER WITH THE SAME

(75) Inventor: Chung-Chun Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/099,139

(22) Filed: Apr. 7, 2008

(65) Prior Publication Data

US 2009/0135991 A1 May 28, 2009

(30) Foreign Application Priority Data

Nov. 26, 2007 (TW) .............................. 96144812 A

(51) Int. Cl.
*G11C 19/00* (2006.01)
(52) U.S. Cl. .............................. 377/64; 377/68; 377/70; 377/74; 377/77; 377/79
(58) Field of Classification Search .................. 377/64, 377/68–70, 73–74, 77–80
See application file for complete search history.

(56) References Cited

U.S. PATENT DOCUMENTS

| | | | |
|---|---|---|---|
| 3,829,711 A | 8/1974 | Crowle | |
| 4,439,691 A | 3/1984 | Bartoli et al. | |
| 7,471,122 B2* | 12/2008 | Huang et al. | 327/112 |
| 7,471,286 B2 | 12/2008 | Chung | |
| 2003/0002615 A1* | 1/2003 | Morosawa et al. | 377/64 |
| 2007/0195920 A1* | 8/2007 | Tobita | 377/64 |
| 2008/0170029 A1* | 7/2008 | Kim | 345/100 |
| 2008/0187089 A1* | 8/2008 | Miyayama et al. | 377/79 |
| 2008/0198961 A1* | 8/2008 | Collins et al. | 377/70 |
| 2008/0226013 A1* | 9/2008 | Deane | 377/70 |

FOREIGN PATENT DOCUMENTS

| | | |
|---|---|---|
| CN | 1598905 A | 3/2005 |
| CN | 1993726 A | 7/2007 |

\* cited by examiner

*Primary Examiner*—Tuan Lam
(74) *Attorney, Agent, or Firm*—Winston Hsu

(57) ABSTRACT

A pre-charge circuit includes a receiving module, an enabling module, and a reset module. The receiving module receives the received driving signal of the pre-charge circuit and outputs the receiving driving signal according to a control signal. The enabling module outputs a pre-charge signal when receiving the driving signal. The reset module is electrically coupled between the receiving module and the enabling module for receiving a reset signal to reset the pre-charge signal.

7 Claims, 11 Drawing Sheets

PRE-CHARGE CIRCUIT AND SHIFT REGISTER WITH THE SAME

BACKGROUND OF THE INVENTION

1. Field of the Invention

The present invention relates to a shift register, and more particularly, to a shift register and a pre-charge circuit thereof having stable pre-charge voltages.

2. Description of the Prior Art

FIG. 1 is a diagram illustrating a conventional shift register constructed by N-type Metal Oxide Semiconductor (NMOS) transistors. As shown in FIG. 1, the shift register 100 comprises an input end I, nodes Z and N, an output end O, a pre-charge circuit 110, an enabling control circuit 120, and three switches $Q_{N2}$, $Q_{N3}$, and $Q_{N4}$. The input end I of the shift register 100 receives driving signals from the shift register of the previous stage (not shown). The output end O of the shift register 100 outputs the driving signals of the shift register 100. The enabling control circuit 120 comprises a switch $Q_{N10}$ and an inverter $INV_1$. The first end of the switch $Q_{N10}$ is coupled to the input end I, and the control end of the switch $Q_{N10}$ receives a clock signal CLK. The second and first ends of the switch $Q_{N10}$ are electrically coupled together according to the clock signal CLK. The input end of the inverter $INV_1$ is electrically coupled to the second end of the switch $Q_{N10}$, and the output end of the inverter $INV_1$ is electrically coupled to the node N for outputting the inverted signal received on the input end of the inverter $INV_1$ to the node N. The pre-charge circuit 110 comprises a switch $Q_{N1}$. The control end of the switch $Q_{N1}$ is electrically coupled to the input end I, the first end of the switch $Q_{N1}$ is electrically coupled to the input end I, and the second end of the switch $Q_{N1}$ is electrically coupled to the node Z. The switch $Q_{N1}$ transmits the signal received on the input end I to the node Z so as to pre-charge the node Z. The control end of the switch $Q_{N2}$ is electrically coupled to the node N, the first end of the switch $Q_{N2}$ is electrically coupled to the node Z, and the second end of the switch $Q_{N2}$ is electrically coupled to the output end O. The control end of the switch $Q_{N3}$ is electrically coupled to the node Z, the first end of the switch $Q_{N3}$ receives the clock signal XCK, and the second end of the switch $Q_{N3}$ is electrically coupled to the output end O. The logic "1" of the clock signals XCK and CLK are set to be 7.5 Volts as the high voltage $V_{DD}$, and the logic "0" of the clock signals XCK and CLK are set to be 0 Volts as the low voltage $V_{SS}$. The voltage setting for the logic levels "0" and "1" of the clock signals are disclosed as an example. The control end of the switch $Q_{N4}$ is electrically coupled to the node N, the first end of the switch $Q_{N4}$ is electrically coupled to the voltage source $V_{SS}$, and the second end of the switch $Q_{N4}$ is electrically coupled to the output end O, and the clock signals CLK and XCK have opposite polarity to each other and have the same frequency.

FIG. 2 is a timing diagram of the shift register 100. As shown in FIG. 2, when the input end I receives the driving signal from the shift register of the previous stage (not shown), the voltage on the input end I rises to the voltage $V_{DD}$, and the pulse width is a half period of the clock signal XCK. The driving signal from the shift register of the previous stage is transmitted through the pre-charge circuit 110 to the node Z and through the enabling controller 120 to the node N. Meanwhile, the first half period of the clock signal XCK is at logic "0". Since the pre-charge circuit 110 is constructed by the switch $Q_{N1}$ (NMOS), the voltage on the node Z is lowered by a source-to-drain voltage $V_{DS}$ of the switch $Q_{N1}$. In this condition, the voltage $V_{DS}$ is the threshold voltage $V_{TH1}$ of the switch $Q_{N1}$, and the threshold voltage $V_{TH1}$ is assumed to be 2.5 Volts. Thus, the voltage on the node Z is 5 Volts ($V_{DD}$−$V_{TH1}$). Since the enabling controller 120 is constructed by the switch $Q_{N10}$ and the inverter $INV_1$, the voltage on the node N is lowered to 0 Volts, and stays the same for one period of the clock signal XCK. As shown in FIG. 2, because the voltage on the node N is 0 Volts, the switches $Q_{N2}$ and $Q_{N4}$ are turned off. In the second half period of the clock signal XCK, in which the clock signal XCK stays at logic "1", the switches $Q_{N1}$, $Q_{N2}$, and $Q_{N3}$ are all turned off, and thus the electric charge accumulated on the node Z has no current path to discharge. The voltage on the node Z is further raised by a voltage $V_{DD}$ to be 12.5 Volts ($2V_{DD}$−$V_{TH1}$=2×7.5−2.5) when the clock signal XCK on the first end of the switch $Q_{N3}$ rises from logic "0" to logic "1", because an intrinsic capacitor $C_1$ exists between the second end of the switch $Q_{N3}$ and the control end of the switch $Q_{N3}$. Therefore, the switch $Q_{N3}$ is turned on and the voltage on the output end O rises to the voltage $V_{DD}$ as the driving signal for the shift register 100. Next, when the voltage on the node N again rises to the voltage $V_{DD}$, the switches $Q_{N2}$ and $Q_{N4}$ are turned on, which lowers the voltage on the output end to be the voltage $V_{SS}$.

According to the above description, when the shift register 100 outputs driving signals, the voltage on the node Z is ($2V_{DD}$−$V_{TH1}$), the voltage on the output end O is $V_{DD}$, and thus the gate-to-source voltage $V_{GS}$ of the switch $Q_{N3}$ should be 5 Volts ($V_{GS}$=$2V_{DD}$−$V_{TH1}$−$V_{DD}$=$V_{DD}$−$V_{TH}$=7.5−2.5). However, the driving ability of the output end O of the shift register 100 is related to the gate-to-source voltage ($V_{GS}$) of the switch $Q_{N3}$. That is, the higher the voltage $V_{GS}$ of the switch $Q_{N3}$ is, the higher the driving ability of the output end O of the shift register 100 is. The threshold voltage $V_{TH}$ varies with fabrication process. Therefore, the voltage $V_{GS}$ of the switch $Q_{N3}$ derived from the equation ($V_{DD}$−$V_{TH1}$) varies with the fabrication process, and thus the driving ability of the shift register 100 is severely affected.

FIG. 3 is a diagram illustrating a conventional shift register fabricated with P-type Metal Oxide Semiconductor (PMOS) transistors. As shown in FIG. 3, the shift register 200 comprises an input end I, nodes Z and N, an output end O, a pre-charge circuit 210, an enabling control circuit 220, and three switches $Q_{P2}$, $Q_{P3}$, and $Q_{P4}$. The input end I of the shift register 200 receives driving signals from the shift register of the previous stage (not shown). The output end O of the shift register 200 outputs the driving signals of the shift register 200. The enabling control circuit 220 comprises a switch $Q_{P10}$ and an inverter $INV_2$. The first end of the switch $Q_{P10}$ is electrically coupled to the input end I, and the control end of the switch $Q_{P10}$ receives a clock signal XCK. The switch $Q_{P10}$ electrically couples the second end of the switch $Q_{P10}$ to the first end of the switch $Q_{P10}$ according to the clock signal XCK. The input end of the inverter $INV_2$ is electrically coupled to the second end of the switch $Q_{P10}$, and the output end of the inverter $INV_2$ is electrically coupled to the node N for outputting the inverted signal received on the input end of the inverter $INV_2$ to the node N. The pre-charge circuit 210 comprises a switch $Q_{P1}$. The control end of the switch $Q_{P1}$ is electrically coupled to the input end I, the first end of the switch $Q_{P1}$ is electrically coupled to the input end I, and the second end of the switch $Q_{P1}$ is electrically coupled to the node Z. The switch $Q_{P1}$ transmits the signal received on the input end I to the node Z so as to pre-charge the node Z. The control end of the switch $Q_{P2}$ is electrically coupled to the node N, the first end of the switch $Q_{P2}$ is electrically coupled to the node Z, and the second end of the switch $Q_{P2}$ is electrically coupled to the output end O. The control end of the switch $Q_{P3}$ is electrically coupled to the node Z, the first end of the switch $Q_{P3}$ receives the clock signal CLK, and the second end of the switch $Q_{P3}$ is electrically coupled to the output end O. The logic "1" of the clock signals XCK and CLK is set to 7.5 Volts as the high voltage $V_{DD}$, and the logic "0" of the clock signals XCK and CLK is set to 0 Volts as the low voltage $V_{SS}$. The voltage setting for the logic levels "0" and "1" of the clock signal are disclosed as an example, which can be designed as desired. The control end of the switch $Q_{P4}$ is electrically coupled to the node N, the first end of the switch $Q_{P4}$ is electrically coupled to the voltage source $V_{DD}$, and the second end of the switch $Q_{P4}$ is electrically coupled to the output end O. However, since the shift register 200 employs the PMOS process, the switches $Q_{P1}$~$Q_{P4}$, and $Q_{P10}$ are PMOS transistors. Additionally, the clock signals CLK and XCK have opposite polarity to each other and have the same frequency.

FIG. 4 is a timing diagram illustrating the shift register 200. As shown in FIG. 4, when the input end I receives the driving signal from the shift register of the previous stage (the voltage on the input end I falls from the voltage $V_{DD}$ to the voltage $V_{SS}$ and the pulse width is a half period of the clock signal CLK), the driving signal from the shift register of the previous stage is transmitted through the pre-charge circuit 210 to the node Z and through the enabling controller 220 to the node N. Meanwhile, the first half period of the clock signal CLK is at logic "1". Since the pre-charge circuit 210 is constructed by the switch $Q_{P1}$ (PMOS), the voltage on the node Z is raised by a source-to-drain voltage $V_{DS}$ of the switch $Q_{P1}$. In this condition, the voltage $V_{DS}$ is the threshold voltage $V_{TH2}$ of the switch $Q_{P1}$, and the threshold voltage $V_{TH2}$ is assumed to be 2.5 Volts. Thus, the voltage on the node Z is 5.5 Volts ($V_{DD}$-$V_{DD}$+$V_{TH2}$). Since the enabling controller 220 is constructed by the switch $Q_{P10}$ and the inverter $INV_2$, the voltage on the node N is raised from 0 Volts to the voltage $V_{DD}$, and stays the same for one period of the clock signal CLK. As shown in FIG. 4, because the voltage on the node N is $V_{DD}$, the switches $Q_{P2}$ and $Q_{P4}$ are turned off. In the second half period of the clock signal CLK, which the clock signal XCK keeps at logic "1", the switches $Q_{P1}$, $Q_{P2}$, and $Q_{P3}$ are all turned off, and thus the electric charge accumulated on the node Z has no current path to dispense. The voltage on the node Z is further lowered by a voltage $V_{DD}$ and to be -2.5 volts ($V_{TH1}$-$V_{DD}$=2.5-5) when the clock signal CLK on the first end of the switch $Q_{P3}$ falls from logic "1" to logic "0" because an intrinsic capacitor $C_2$ exists between the second end of the switch $Q_{P3}$ and the control end of the switch $Q_{P3}$. Therefore, the switch $Q_{P3}$ is turned on and the voltage on the output end O falls to 0 Volts as the driving signal for the shift register 200. Next, when the voltage on the node N again falls to 0 Volts, the switches $Q_{P2}$ and $Q_{P4}$ are turned on, which raises the voltage on the output end O to be the voltage $V_{DD}$.

It can be seen from the above that when the shift register 200 outputs driving signals, the voltage on the node Z is (-$V_{DD}$+$V_{TH2}$), the voltage on the output end O is 0 Volts, and thus the gate-to-source voltage $V_{GS}$ of the switch $Q_{P3}$ should be -5 Volts ($V_{GS}$=-$V_{DD}$+$V_{TH2}$-0=-7.5+2.5). However, the driving ability of the output end O of the shift register 200 is related to the $V_{GS}$ of the switch $Q_{P3}$. That is, the higher the voltage $V_{GS}$ of the switch $Q_{P3}$ is, the higher the driving ability of the output end O of the shift register 200 is. The threshold voltage $V_{TH}$ varies with fabrication process. Therefore, the voltage $V_{GS}$ of the switch $Q_{P3}$ derived from the equation (-$V_{DD}$+$V_{TH2}$) varies with the fabrication process, and thus the driving ability of the shift register 200 is severely affected.

SUMMARY OF THE INVENTION

The present invention provides a pre-charge circuit used in a shift register. The pre-charge circuit comprises an input end for receiving a driving signal, an output end for outputting a pre-charge signal, a receiving module, an enabling module electrically coupled between the output end of the receiving module and the output end of the pre-charge circuit for outputting the pre-charge signal when receiving the driving signal, and a reset module electrically coupled between the output end of the receiving module and the enabling module for receiving a reset signal in order to reset the pre-charge signal. The receiving module comprises an input end electrically coupled to the input end of the pre-charge circuit for receiving the driving signal, a control end for receiving a control signal, and an output end for transmitting the driving signal when the receiving module receives the control signal.

The present invention further provides a shift register. The shift register comprises an input end for receiving a first driving signal, an output end for outputting a second driving signal, an enabling controller electrically coupled to the input end of the shift register for outputting an enabling signal when receiving the first driving signal wherein the enabling signal is an inverse signal of the first driving signal, a pre-charge circuit, a first switch, a second switch, and a third switch. The pre-charge circuit comprises an input end electrically coupled to the input end of the shift register for receiving the first driving signal, an output end for outputting a pre-charge signal, a receiving module, an enabling module electrically coupled between the output end of the receiving module and the output end of the pre-charge circuit for outputting the pre-charge signal when receiving the first driving signal, and a reset module electrically coupled between the output end of the receiving module and the enabling module for receiving a reset signal in order to reset the pre-charge signal. The receiving module comprises an input end electrically coupled to the input end of the pre-charge circuit for receiving the first driving signal, a control end for receiving a control signal, and an output end for transmitting the first driving signal when the receiving module receives the control signal. The first switch comprises a first end for receiving a clock signal, a control end electrically coupled to the output end of the pre-charge circuit for receiving the pre-charge signal, and a second end electrically coupled to the output end of the shift register for coupling to the first end of the first switch when the first switch receives the pre-charge signal. The second switch comprises a first end electrically coupled to a first voltage source, a control end electrically coupled to an output end of the enabling controller for receiving the enabling signal, and a second end electrically coupled to the output end of the shift register for coupling to the first end of the second switch when the second switch receives the enabling signal. The third switch comprises a first end electrically coupled to the output end of the pre-charge circuit, a control end electrically coupled to the output end of the enabling controller for receiving the enabling signal, and a second end electrically coupled to the output end of the shift register for coupling to the first end of the third switch when the third switch receives the enabling signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
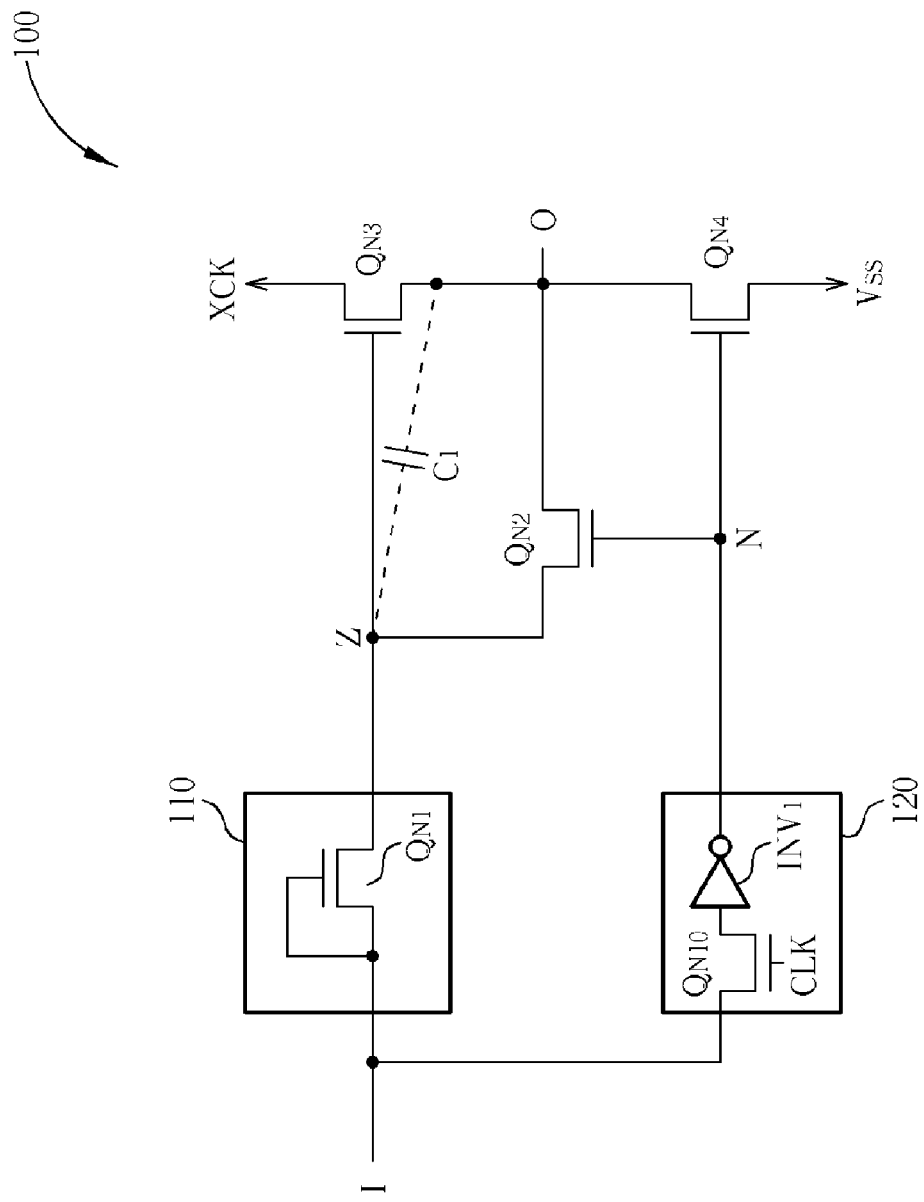
FIG. 1 is a diagram illustrating a conventional shift register fabricated constructed by NMOS transistors.
Figure 2:
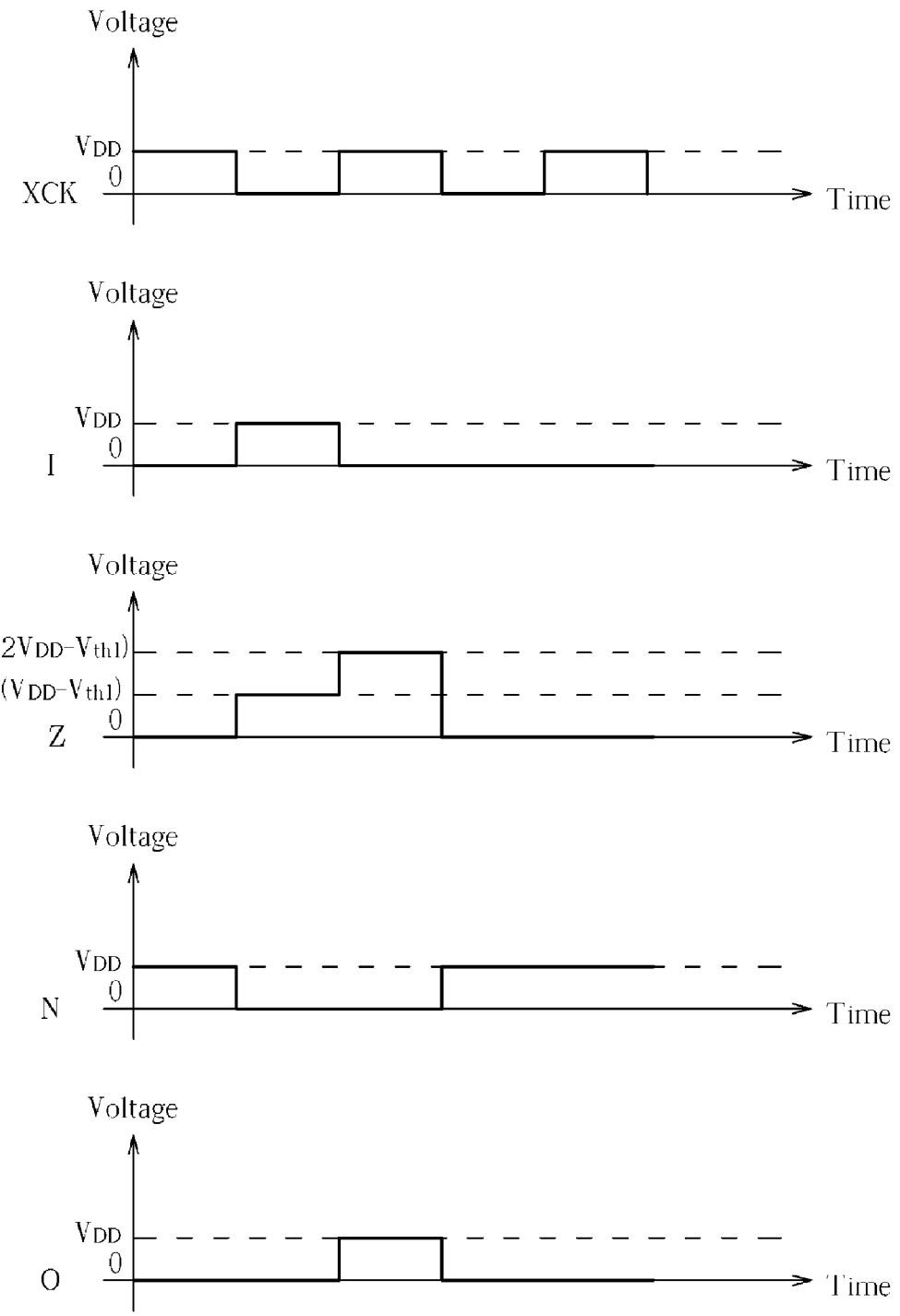
FIG. 2 is a timing diagram illustrating the shift register in FIG. 1.
Figure 3:
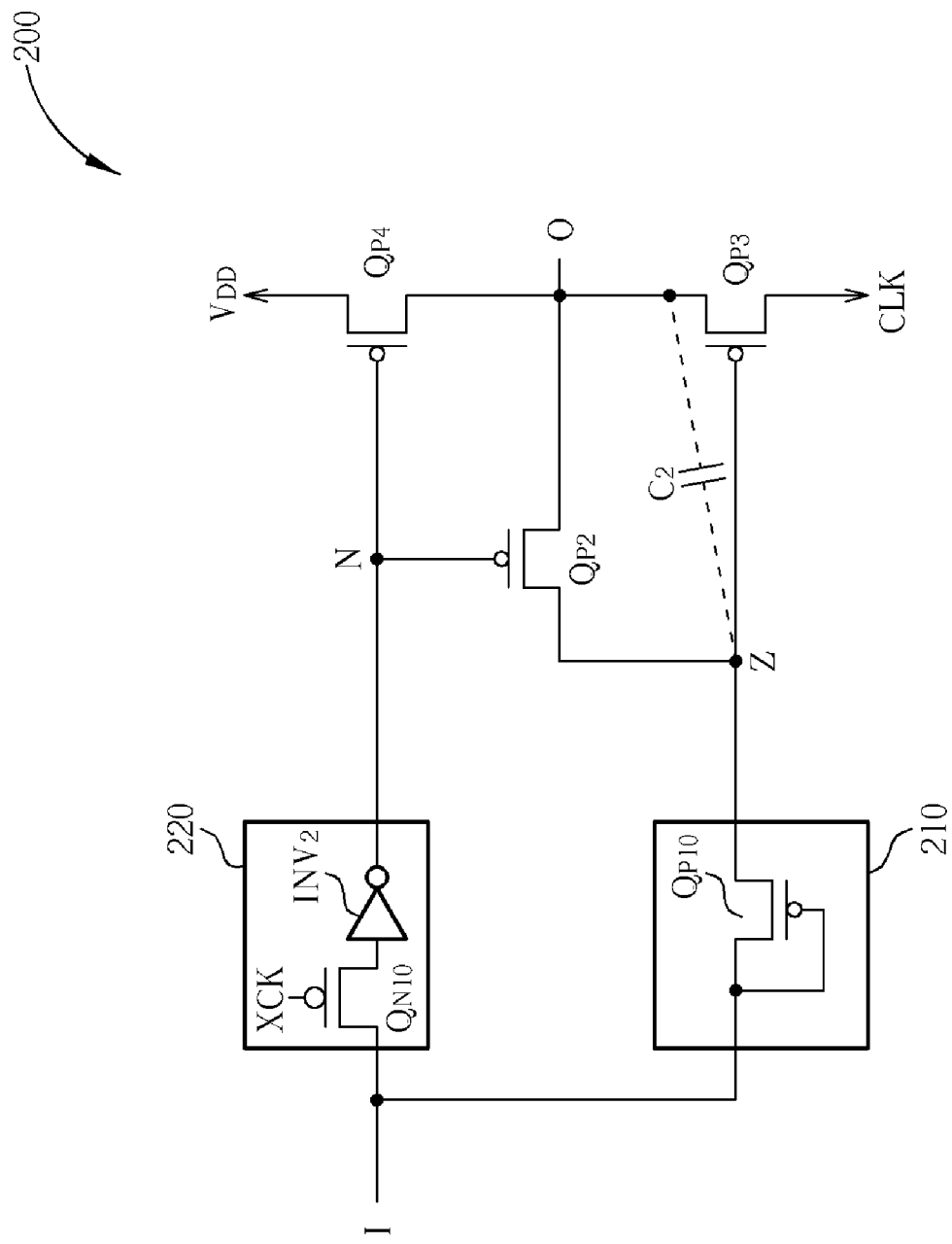
FIG. 3 is a diagram illustrating a conventional shift register constructed by PMOS transistors.
Figure 4:
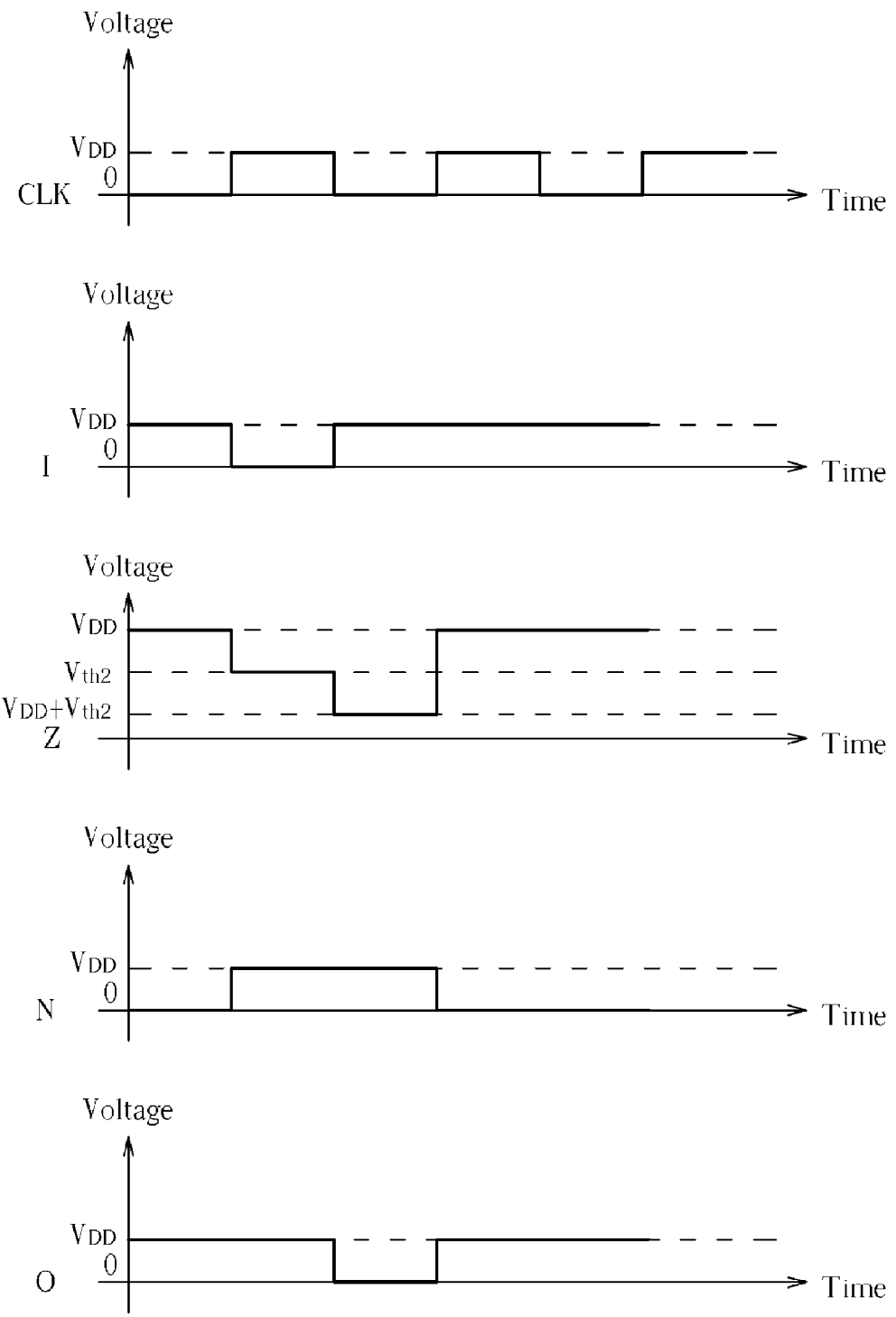
FIG. 4 is a timing diagram illustrating the shift register in FIG. 3.
Figure 5:
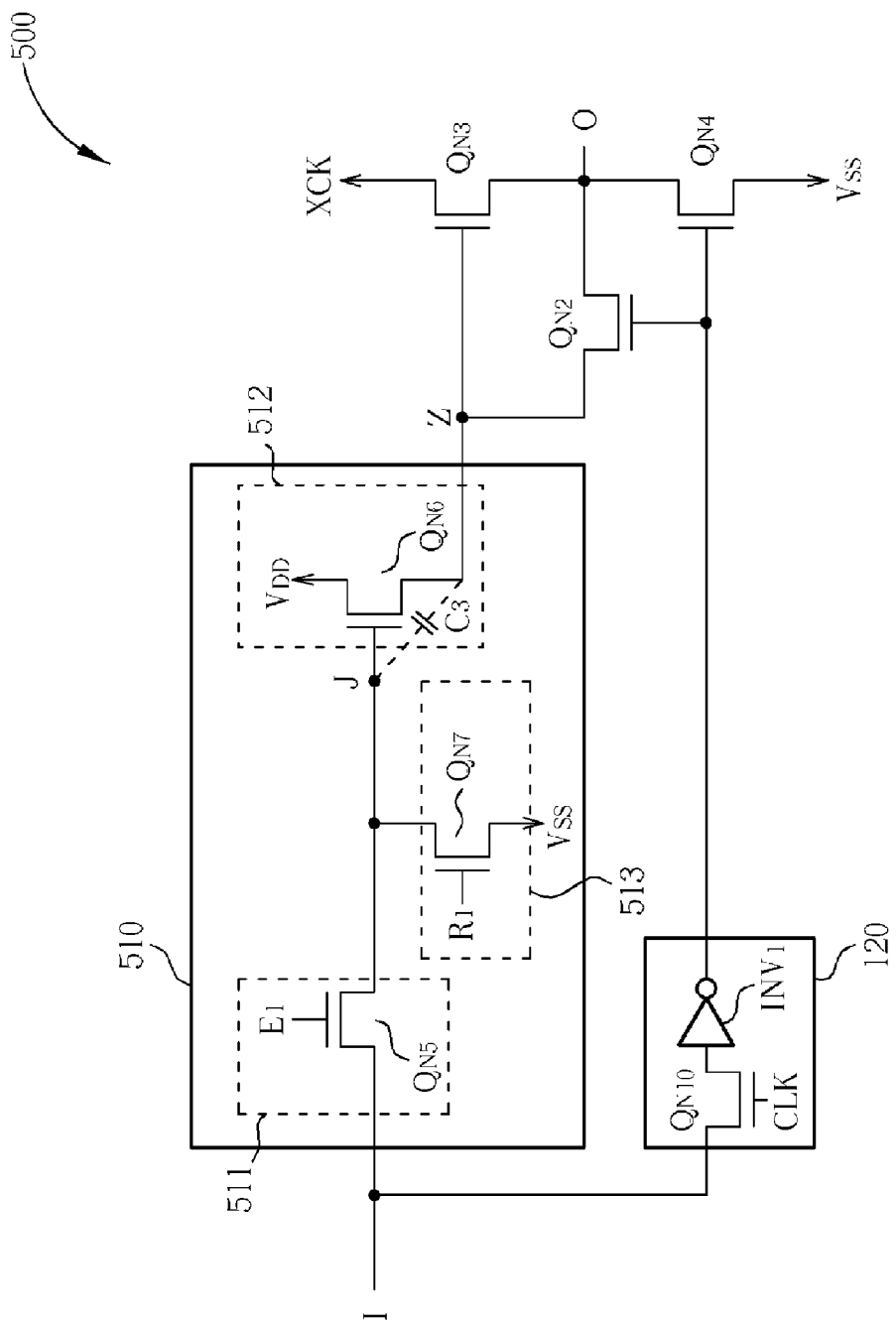
FIG. 5 is a diagram illustrating a first embodiment of the present invention.

Referring to FIG. 5, a diagram illustrating a first embodiment of the present invention is shown. The shift register 500 is constructed by NMOS transistors. As shown in FIG. 5, the shift register 500 comprises an input end I, nodes Z and N, an output end O, a pre-charge circuit 510, an enabling control circuit 120, and three switches $Q_{N2}$, $Q_{N3}$, and $Q_{N4}$. The input end I of the shift register 500 receives driving signals from the shift register of the previous stage (not shown). The output end O of the shift register 500 outputs the driving signals of the shift register 500. The enabling control circuit 120 comprises a switch $Q_{N10}$ and an inverter $INV_1$. The first end of the switch $Q_{N10}$ is electrically coupled to the input end I, and the control end of the switch $Q_{N10}$ receives a clock signal CLK. The switch $Q_{N10}$ electrically couples the second end of the switch $Q_{N10}$ to the first end of the switch $Q_{N10}$ according to the clock signal CLK. The input end of the inverter $INV_1$ is electrically coupled to the second end of the switch $Q_{N10}$, and the output end of the inverter $INV_1$ is electrically coupled to the node N for outputting the inverted signal received on the input end of the inverter $INV_1$ to the node N. The pre-charge circuit 510 comprises a receiving module 511, an enabling module 512, a reset module 513, and a node J. The control end of the switch $Q_{N2}$ is electrically coupled to the node N, the first end of the switch $Q_{N2}$ is electrically coupled to the node Z, and the second end of the switch $Q_{N2}$ is electrically coupled to the output end O. The control end of the switch $Q_{N3}$ is electrically coupled to the node Z, the first end of the switch $Q_{N3}$ receives the clock signal XCK, and the second end of the switch $Q_{N3}$ is electrically coupled to the output end O. The logic "1" of the clock signals XCK and CLK are set to be 7.5 Volts as the high voltage $V_{DD}$, and the logic "0" of the clock signals XCK and CLK are set to be 0 Volts as the low voltage $V_{SS}$. The voltage setting for the logic "0" and "1" of the clock signals are disclosed as an example, which can be designed as desired. The control end of the switch $Q_{N4}$ is electrically coupled to the node N, the first end of the switch $Q_{N4}$ is electrically coupled to the voltage source $V_{SS}$ (the voltage $V_{SS}$ is set to be 0 Volts), and the second end of the switch $Q_{N4}$ is electrically coupled to the output end O.

The receiving module 511 comprises a switch $Q_{N5}$. The control end of the switch $Q_{N5}$ receives the control signal $E_1$, the first end of the switch $Q_{N5}$ is electrically coupled to input end I, and the second end of the switch $Q_{N5}$ is electrically coupled to the node J. When the switch $Q_{N5}$ receives the control signal $E_1$, the second end of the switch $Q_{N5}$ electrically couples to the first end of the switch $Q_{N5}$ for transmitting the signal received on the input end I to the node J.

The enabling module 512 comprises a switch $Q_{N6}$. The control end of the switch $Q_{N6}$ is electrically coupled to the node J for receiving the signal transmitted from the receiving module 511, the first end of the switch $Q_{N6}$ is electrically coupled to voltage source $V_{DD}$, and the second end of the switch $Q_{N6}$ is electrically coupled to the node Z. When the switch $Q_{N6}$ receives the signal transmitted from the receiving module 511, the second end of the switch $Q_{N6}$ electrically couples to the first end of the switch $Q_{N6}$, and the voltage on the node Z is raised to be the voltage $V_{DD}$.

The reset module 513 comprises a switch $Q_{N7}$. The control end of the switch $Q_{N7}$ receives the reset signal $R_1$, the first end of the switch $Q_{N7}$ is electrically coupled to voltage source $V_{SS}$, and the second end of the switch $Q_{N7}$ is electrically coupled to the node J. When the switch $Q_{N7}$ receives the reset signal $R_1$, the second end of the switch $Q_{N7}$ electrically couples to the first end of the switch $Q_{N7}$, and the voltage on the node J is lowered to be the voltage $V_{SS}$, which turns off the switch $Q_{N6}$ of the enabling module 512 and stops raising the voltage on the node Z.

The shift register 500 is an example realized with NMOS transistors, and consequently the switches $Q_{N2}$~$Q_{N7}$ and $Q_{N10}$ are all NMOS transistors.

Figure 6:
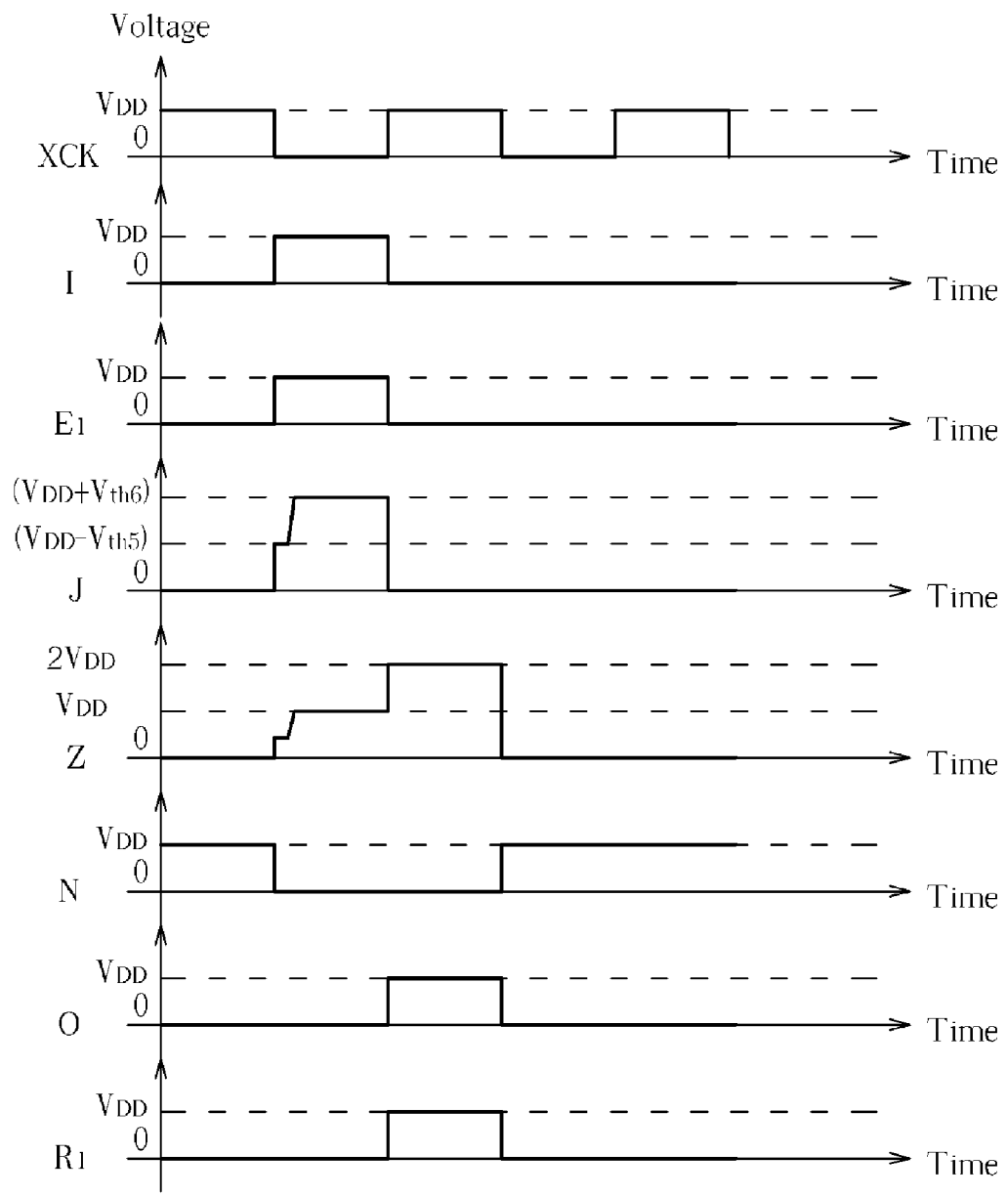
FIG. 6 is a timing diagram illustrating the shift register in FIG. 5.

FIG. 6 is a timing diagram of the shift register 500. As shown in FIG. 6, when the input end I receives the driving signal from the shift register of the previous stage (not shown), the voltage on the input end I rises to the voltage $V_{DD}$ and the pulse width is a half period of the clock signal XCK, the driving signal from the shift register of the previous stage is transmitted through the pre-charge circuit 510 to the node Z and through the enabling controller 520 to the node N. Meanwhile, the first half period of the clock signal XCK is at logic "0", and in the pre-charge circuit 510, the switch $Q_{N5}$ is turned on by the control signal $E_1$ and consequently transmits the driving signal of the shift register of the previous stage to the node J. Since the switch $Q_{N5}$ is an NMOS transistor, the voltage on the node J is lowered by a $V_{DS}$ of the switch $Q_{N5}$. In this condition, the voltage $V_{DS}$ is the threshold voltage $V_{TH5}$ of the switch $Q_{N5}$, and the threshold voltage $V_{TH5}$ is assumed to be 2.5 Volts. Thus, the voltage on the node J is 5 Volts ($V_{DD}$−$V_{TH5}$). The switch $Q_{N6}$ of the enabling module 512 is turned on by the voltage on the node j and consequently raises the voltage on the node Z to the voltage $V_{DD}$. The voltage on the node Z can be raised in this period of time because of the existence of the parasitic capacitor $C_3$ of the switch $Q_{N6}$ between the nodes J and Z. When the voltage on the node Z is raised to the voltage $V_{DD}$, the capacitor $C_3$ is charged and consequently the voltage on the node J is further raised to the voltage ($V_{DD}$+$V_{TH6}$). In this way, the switch $Q_{N6}$ is kept turned-on and the voltage on the node Z is kept at the voltage $V_{DD}$. Since the enabling controller 120 is constructed by the inverter $INV_1$, the voltage on the node N is lowered from the voltage $V_{DD}$ to 0 Volts, and stays the same for one period of the clock signal XCK. As shown in FIG. 6, because the voltage on the node N is 0 Volts, the switches $Q_{N2}$ and $Q_{N4}$ are turned off. In the second half period of the clock signal XCK, in which the clock signal XCK stays at logic "1", the switches $Q_{N6}$, $Q_{N2}$, and $Q_{N3}$ are all turned off, and thus the electric charge accumulated on the node Z has no current path to discharge. The voltage on the node Z is further raised by a voltage $V_{DD}$, and to be 15 Volts ($2V_{DD}=2\times7.5=15$) when the clock signal XCK on the first end of the switch $Q_{N3}$ rises from logic "0" to logic "1" because an intrinsic capacitor $C_1$ exists between the first end of the switch $Q_{N3}$ and the control end of the switch $Q_{N3}$. Therefore, the switch $Q_{N3}$ is turned on and the voltage on the output end O is raised to the voltage $V_{DD}$ (7.5 Volts) as the driving signal for the shift register 500. Next, when the voltage on the node N is raised again to the voltage $V_{DD}$, the switches $Q_{N2}$ and $Q_{N4}$ are turned on, which lowers the voltage on the output end O to be the voltage $V_{SS}$ (0 Volts). The reset module 513 receives the reset signal $R_1$ at the same time and turns on the switch $Q_{N7}$, which lowers the voltage on the node J so that the switch $Q_{N6}$ of the enabling module 512 is turned off and stops raising the voltage on the node Z.

The reset signal $R_1$ can be the inverted signal of the clock signal XCK, which is the clock signal CLK. The reset signal $R_1$ can also be the driving signal of the shift register 500 if the control end of the switch $Q_{N7}$ is electrically coupled to the output end O. The control signal $E_1$ can be the inverted signal of the clock signal XCK, which is the clock signal CLK. The control signal $E_1$ can also be the driving signal of the shift register of the previous stage if the control end of the switch $Q_{N5}$ is electrically coupled to the input end I.

According to the above description, when the shift register 500 outputs driving signals, the voltage on the node Z is $2V_{DD}$, the voltage on the output end O is $V_{DD}$, and thus the $V_{GS}$ of the switch $Q_{N3}$ should be 7.5 Volts ($V_{GS}=2V_{DD}=7.5$). However, the driving ability of the output end O of the shift register 500 relates to the $V_{GS}$ of the switch $Q_{N3}$. That is, the higher the voltage $V_{GS}$ of the switch $Q_{N3}$ is, the higher the driving ability of the output end O of the shift register 500 is. Therefore, the voltage $V_{GS}$ of the switch $Q_{N3}$ derived from the equation above is not affected by the threshold voltage variation from different fabrication processes. Thus, the shift register 500 of the present invention provides high stability and high driving ability.

Figure 7:
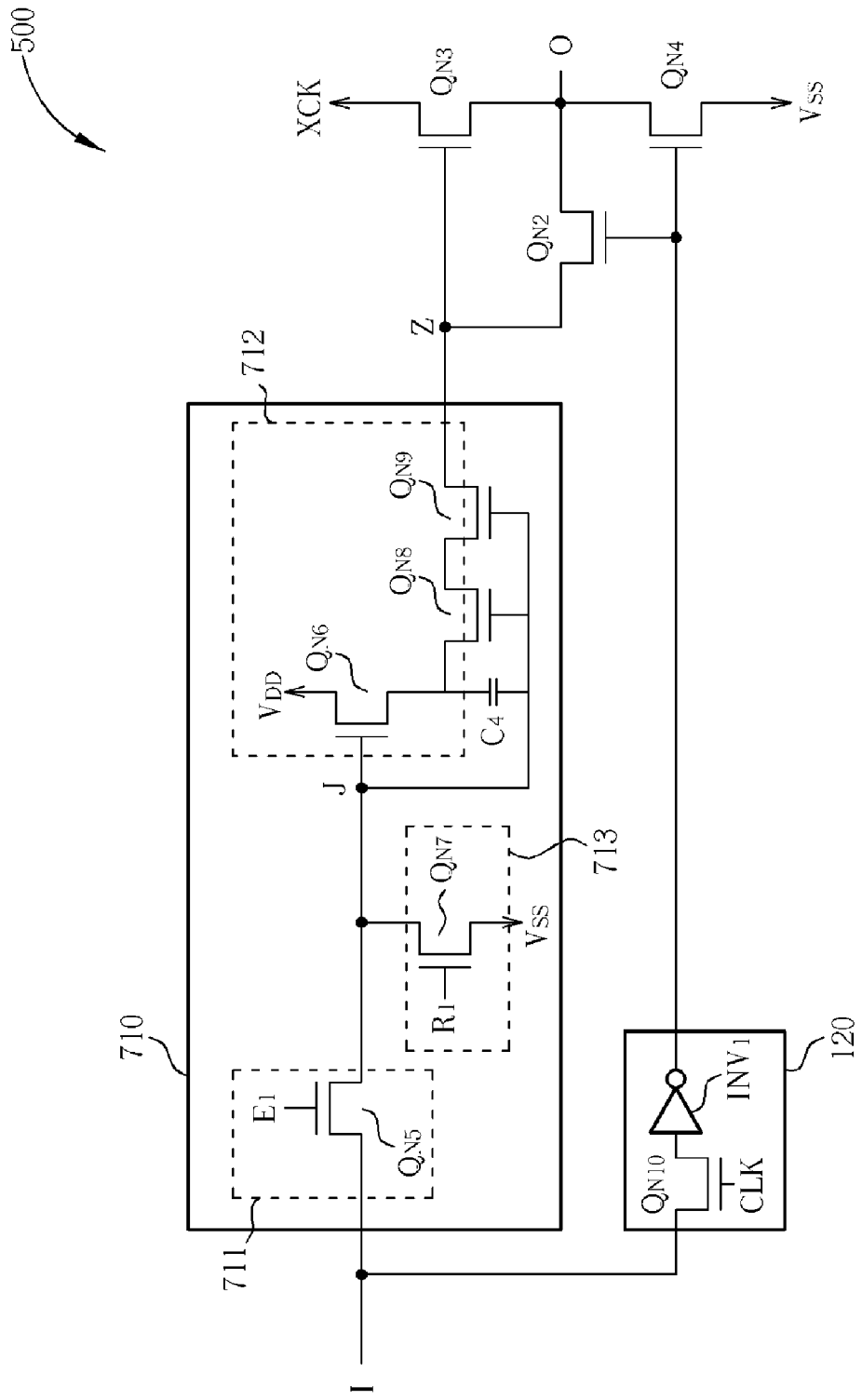
FIG. 7 is a diagram illustrating a second embodiment of the present invention.

FIG. 7 is a diagram illustrating a second embodiment of the present invention. The shift register 700 comprises an input end I, nodes Z and N, an output end O, a pre-charge circuit 710, an enabling controller 120, and three switches $Q_{N2}$, $Q_{N3}$, and $Q_{N4}$. The pre-charge circuit 710 comprises a receiving module 711, an enabling module 712, a reset module 713, and a node J. The shift register 700 is similar to the shift register 500, and the difference between the shift registers 500 and 700 is that in the enabling module 712 of the pre-charge circuit 710 of the shift register 700, a capacitor $C_4$ and two switches $Q_{N8}$ and $Q_{N9}$ are added. The capacitor $C_4$ is electrically coupled between the node J and the second end of the switch $Q_{N6}$. The control end of the switch $Q_{N8}$ is electrically coupled to the node J, the first end of the switch $Q_{N8}$ is electrically coupled to the second end of the switch $Q_{N6}$, and the second end of the switch $Q_{N8}$ is electrically coupled to the first end of the switch $Q_{N9}$. The control end of the switch $Q_{N9}$ is electrically coupled to the node J, the first end of the switch $Q_{N9}$ is electrically coupled to the second end of the switch $Q_{N8}$, and the second end of the switch $Q_{N9}$ is electrically coupled to the node Z. The switches $Q_{N8}$ and $Q_{N9}$ are both NMOS transistors.

Figure 8:
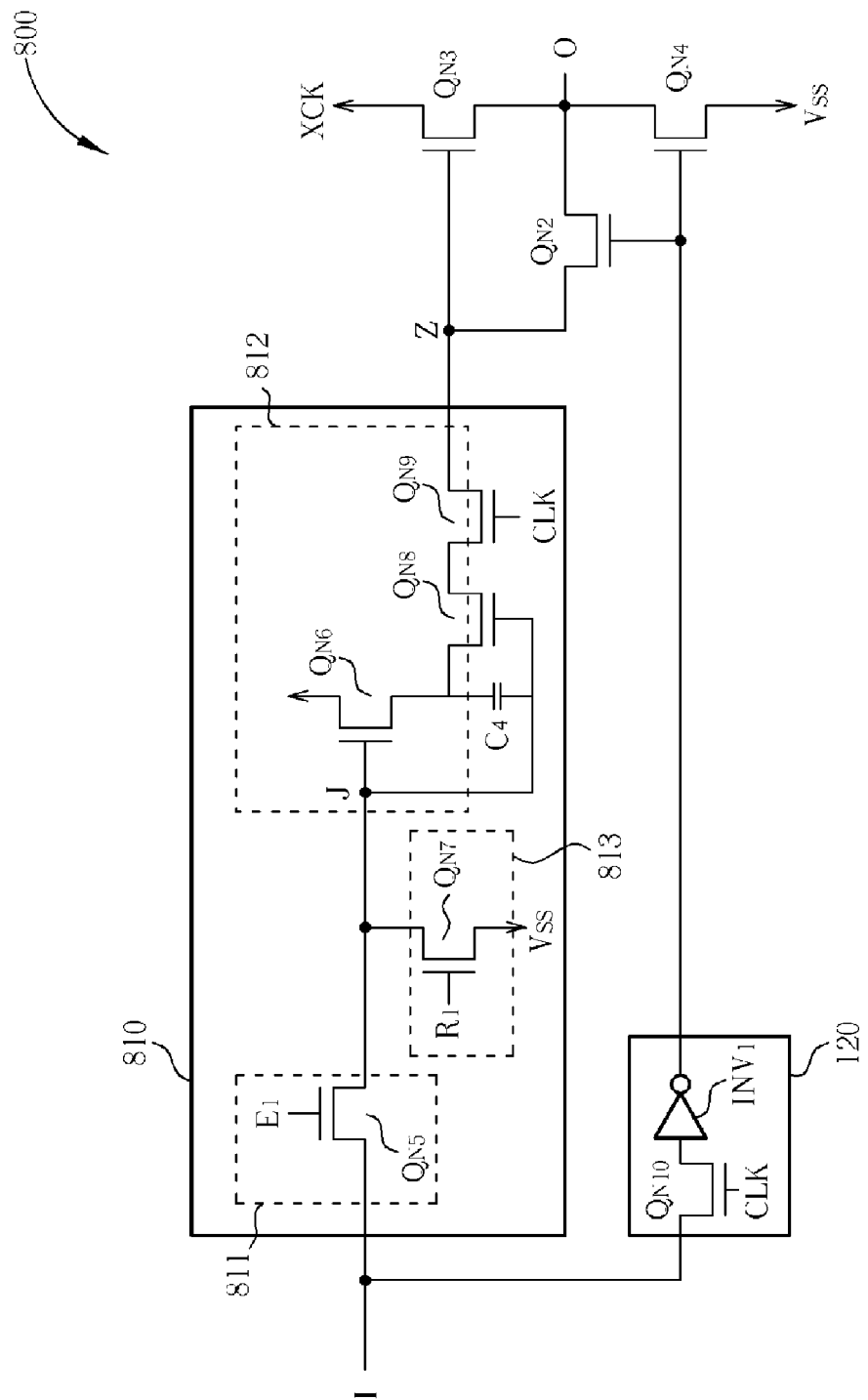
FIG. 8 is a diagram illustrating a third embodiment of the present invention.

FIG. 8 is a diagram illustrating a third embodiment of the shift register of the present invention. The shift register 800 comprises an input end I, nodes Z and N, an output end O, a pre-charge circuit 810, an enabling controller 120, and three switches $Q_{N2}$, $Q_{N3}$, and $Q_{N4}$. The pre-charge circuit 710 comprises a receiving module 811, an enabling module 812, a reset module 813, and a node J. The shift register 800 is similar to the shift register 500, and the difference between the shift registers 500 and 800 is that in the enabling module 812 of the pre-charge circuit 810 of the shift register 800, a capacitor $C_4$ and two switches $Q_{N8}$ and $Q_{N9}$ are added. The capacitor $C_4$ is electrically coupled between the node J and the second end of the switch $Q_{N6}$. The control end of the switch $Q_{N8}$ is electrically coupled to the node J, the first end of the switch $Q_{N8}$ is electrically coupled to the second end of the switch $Q_{N6}$, and the second end of the switch $Q_{N8}$ is electrically coupled to the first end of the switch $Q_{N9}$. The control end of the switch $Q_{N9}$ receives the inverted signal of the clock signal XCK, which is the clock signal CLK, the first end of the switch $Q_{N9}$ is electrically coupled to the second end of the switch $Q_{N8}$, and the second end of the switch $Q_{N9}$ is electrically coupled to the node Z. The switches $Q_{N8}$ and $Q_{N9}$ are both NMOS transistors.

Figure 9:
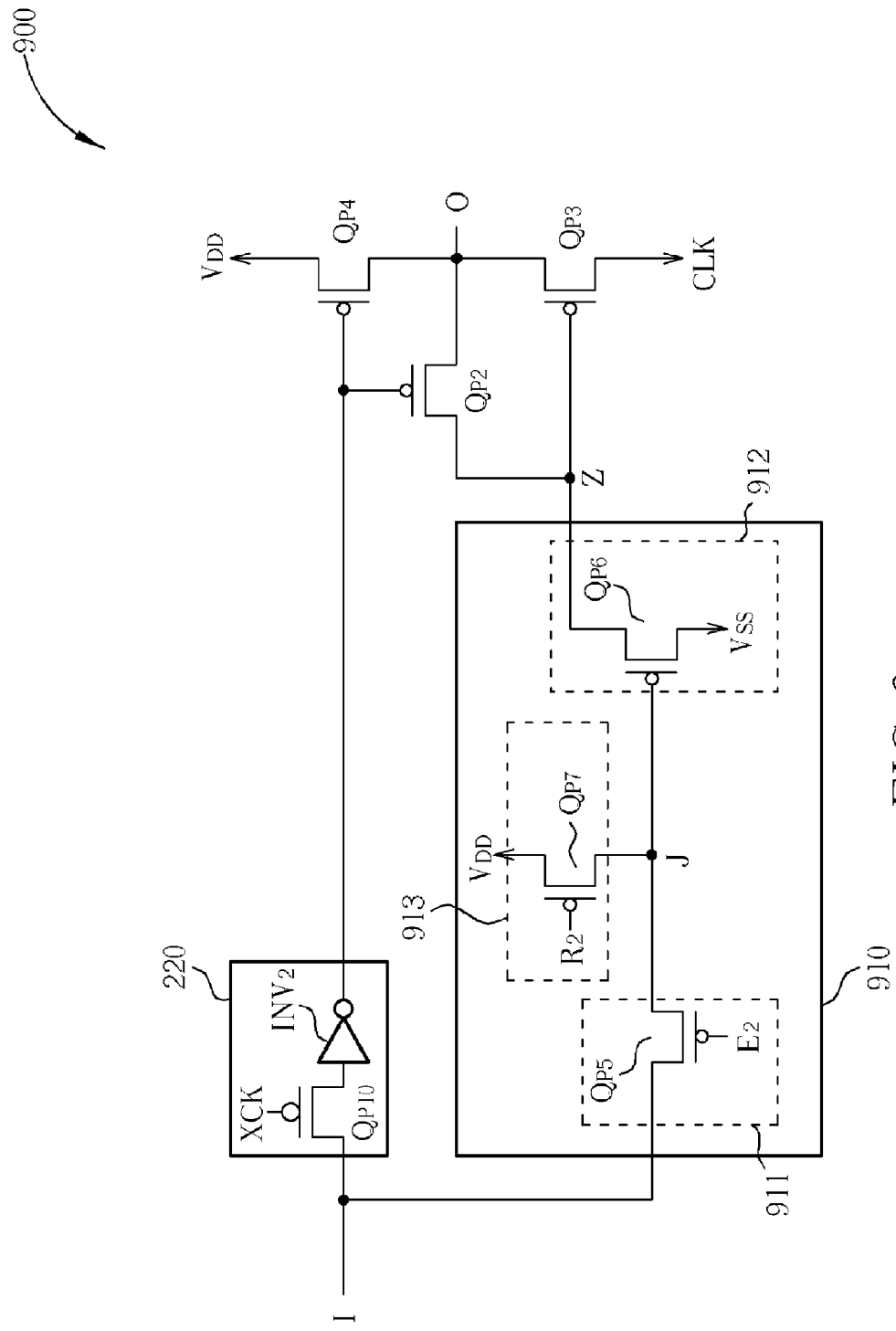
FIG. 9 is a diagram illustrating a fourth embodiment of the present invention.

FIG. 9 is a diagram illustrating a fourth embodiment of the shift register of the present invention. The shift register 900 is fabricated with PMOS transistors. As shown in FIG. 9, the shift register 900 comprises an input end I, nodes Z and N, an output end O, a pre-charge circuit 910, an enabling control circuit 220, and three switches $Q_{P2}$, $Q_{P3}$, and $Q_{P4}$. The input end I of the shift register 900 receives driving signals from the shift register of the previous stage (not shown). The output end O of the shift register 900 outputs the driving signals of the shift register 900. The enabling control circuit 220 comprises a switch $Q_{P10}$ and an inverter $INV_2$. The first end of the switch $Q_{P10}$ is electrically coupled to the input end I, and the control end of the switch $Q_{P10}$ receives a clock signal XCK. The switch $Q_{P10}$ electrically couples the second end of the switch $Q_{P10}$ to the first end of the switch $Q_{P10}$ according to the clock signal XCK. The input end of the inverter $INV_2$ is electrically coupled to the second end of the switch $Q_{P10}$, and the output end of the inverter $INV_2$ is electrically coupled to the node N for outputting the inverted signal received on the input end of the inverter $INV_2$ to the node N. The pre-charge circuit 910 comprises a receiving module 911, an enabling module 912, a reset module 913, and a node J. The control end of the switch $Q_{P2}$ is electrically coupled to the node N, the first end of the switch $Q_{P2}$ is electrically coupled to the node Z, and the second end of the switch $Q_{P2}$ is electrically coupled to the output end O. The control end of the switch $Q_{P3}$ is electrically coupled to the node Z, the first end of the switch $Q_{P3}$ receives the clock signal CLK, and the second end of the switch $Q_{P3}$ is electrically coupled to the output end O. The logic "1" of the clock signals XCK and CLK are set to be 7.5 Volts as the high voltage $V_{DD}$, and the logic "0" of the clock signals XCK and CLK are set to be 0 Volts as the low voltage $V_{SS}$. The voltage setting for the logic "0" and "1" of the clock signals are disclosed as an example, which can be designed as desired. The control end of the switch $Q_{P4}$ is electrically coupled to the node N, the first end of the switch $Q_{P4}$ is electrically coupled to the voltage source $V_{DD}$ (the voltage $V_{DD}$ is set to be 7.5 Volts), and the second end of the switch $Q_{P4}$ is electrically coupled to the output end O.

The receiving module 911 comprises a switch $Q_{P5}$. The control end of the switch $Q_{P5}$ receives the control signal $E_2$, the first end of the switch $Q_{P5}$ is electrically coupled to input end I, and the second end of the switch $Q_{P5}$ is electrically coupled to the node J. When the switch $Q_{P5}$ receives the control signal $E_2$, the second end of the switch $Q_{P5}$ electrically couples to the first end of the switch $Q_{P5}$ for transmitting the signal received on the input end I to the node J.

The enabling module 912 comprises a switch $Q_{P6}$. The control end of the switch $Q_{P6}$ is electrically coupled to the node J for receiving the signal transmitted from the receiving module 911, the first end of the switch $Q_{P6}$ is electrically coupled to voltage source $V_{SS}$, and the second end of the switch $Q_{P6}$ is electrically coupled to the node Z. When the switch $Q_{P6}$ receives the signal transmitted from the receiving module 911, the second end of the switch $Q_{P6}$ electrically couples to the first end of the switch $Q_{P6}$, and the voltage on the node Z is lowered to be the voltage $V_{SS}$.

The reset module 913 comprises a switch $Q_{P7}$. The control end of the switch $Q_{P7}$ receives the reset signal $R_2$, the first end of the switch $Q_{P7}$ is electrically coupled to voltage source $V_{DD}$, and the second end of the switch $Q_{P7}$ is electrically coupled to the node J. When the switch $Q_{P7}$ receives the reset signal $R_2$, the second end of the switch $Q_{P7}$ electrically couples to the first end of the switch $Q_{P7}$, and the voltage on the node J is raised to be the voltage $V_{DD}$, which turns off the switch $Q_{P6}$ of the enabling module 912 and stops lowering the voltage on the node Z.

The shift register 900 is an example with realization of PMOS transistors, and consequently the switches $Q_{P2} \sim Q_{P7}$ and $Q_{P10}$ are all PMOS transistors.

The operation of the shift register 900 is similar to the operation of the shift register 500, and thus the related description is omitted.

The reset signal $R_2$ can be the inverted signal of the clock signal CLK, which is the clock signal XCK. The reset signal $R_2$ can also be the driving signal of the shift register 900 if the control end of the switch $Q_{P7}$ is electrically coupled to the output end O. The control signal $E_2$ can be the inverted signal of the clock signal CLK, which is the clock signal XCK. The control signal $E_2$ can also be the driving signal of the shift register of the previous stage (not shown) if the control end of the switch $Q_{P5}$ is electrically coupled to the input end I.

Figure 10:
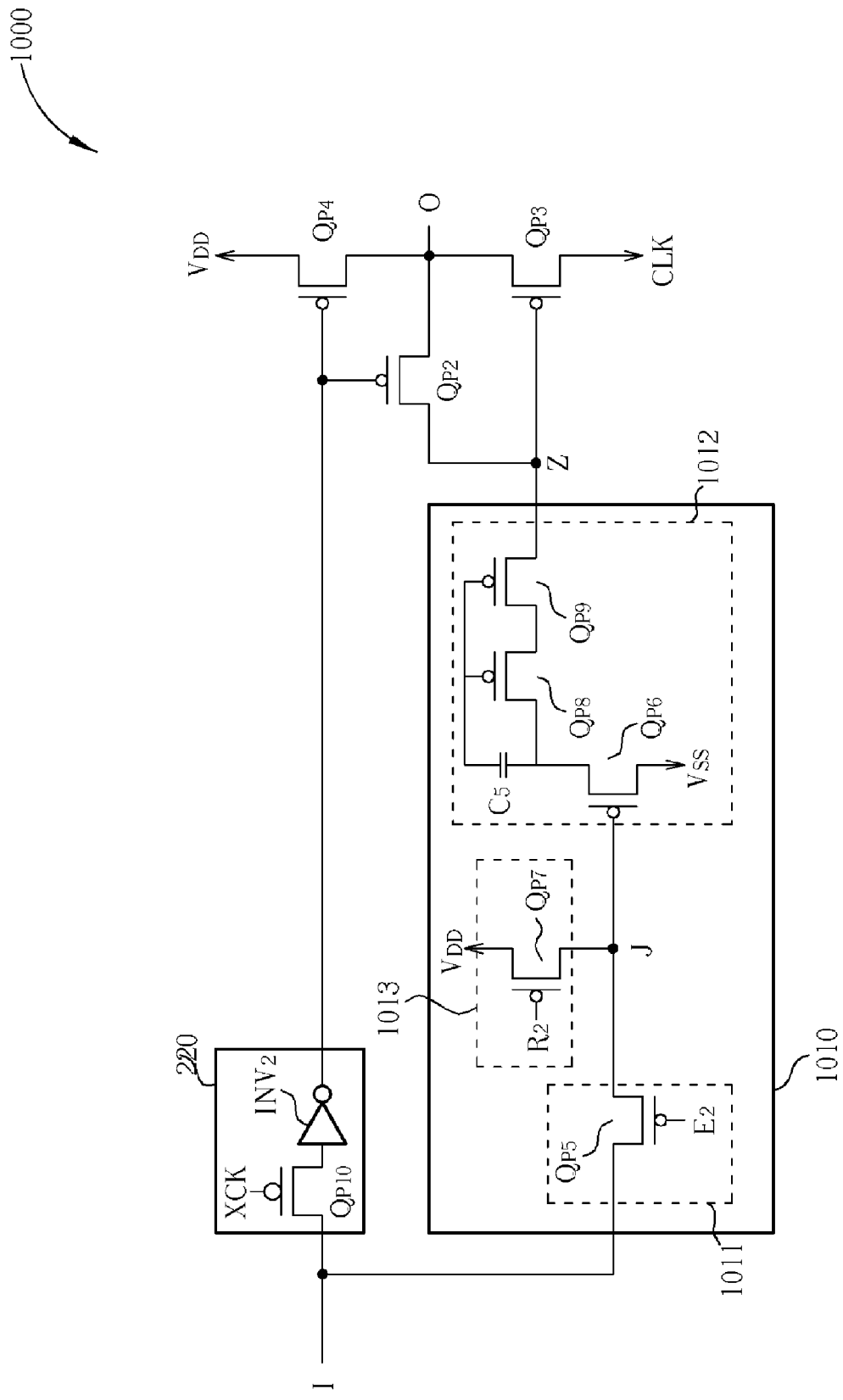
FIG. 10 is a diagram illustrating a fifth embodiment of the present invention.

FIG. 10 is a diagram illustrating a fifth embodiment of the shift register of the present invention. The shift register 1000 comprises an input end I, nodes Z and N, an output end O, a pre-charge circuit 1010, an enabling controller 220, and three switches $Q_{P2}$, $Q_{P3}$, and $Q_{P4}$. The pre-charge circuit 1010 comprises a receiving module 1011, an enabling module 1012, a reset module 1013, and a node J. The shift register 1000 is similar to the shift register 900, and the difference between the shift registers 900 and 1000 is that in the enabling module 1012 of the pre-charge circuit 1010 of the shift register 1000, a capacitor $C_5$ and two switches $Q_{P8}$ and $Q_{P9}$ are added. The capacitor $C_5$ is electrically coupled between the node J and the second end of the switch $Q_{P6}$. The control end of the switch $Q_{P8}$ is electrically coupled to the node J, the first end of the switch $Q_{P8}$ is electrically coupled to the second end of the switch $Q_{P6}$, and the second end of the switch $Q_{P8}$ is electrically coupled to the first end of the switch $Q_{P9}$. The control end of the switch $Q_{P9}$ is electrically coupled to the node J, the first end of the switch $Q_{P9}$ is electrically coupled to the second end of the switch $Q_{P8}$, and the second end of the switch $Q_{P9}$ is electrically coupled to the node Z. The switches $Q_{P8}$ and $Q_{P9}$ are both PMOS transistors.

Figure 11:
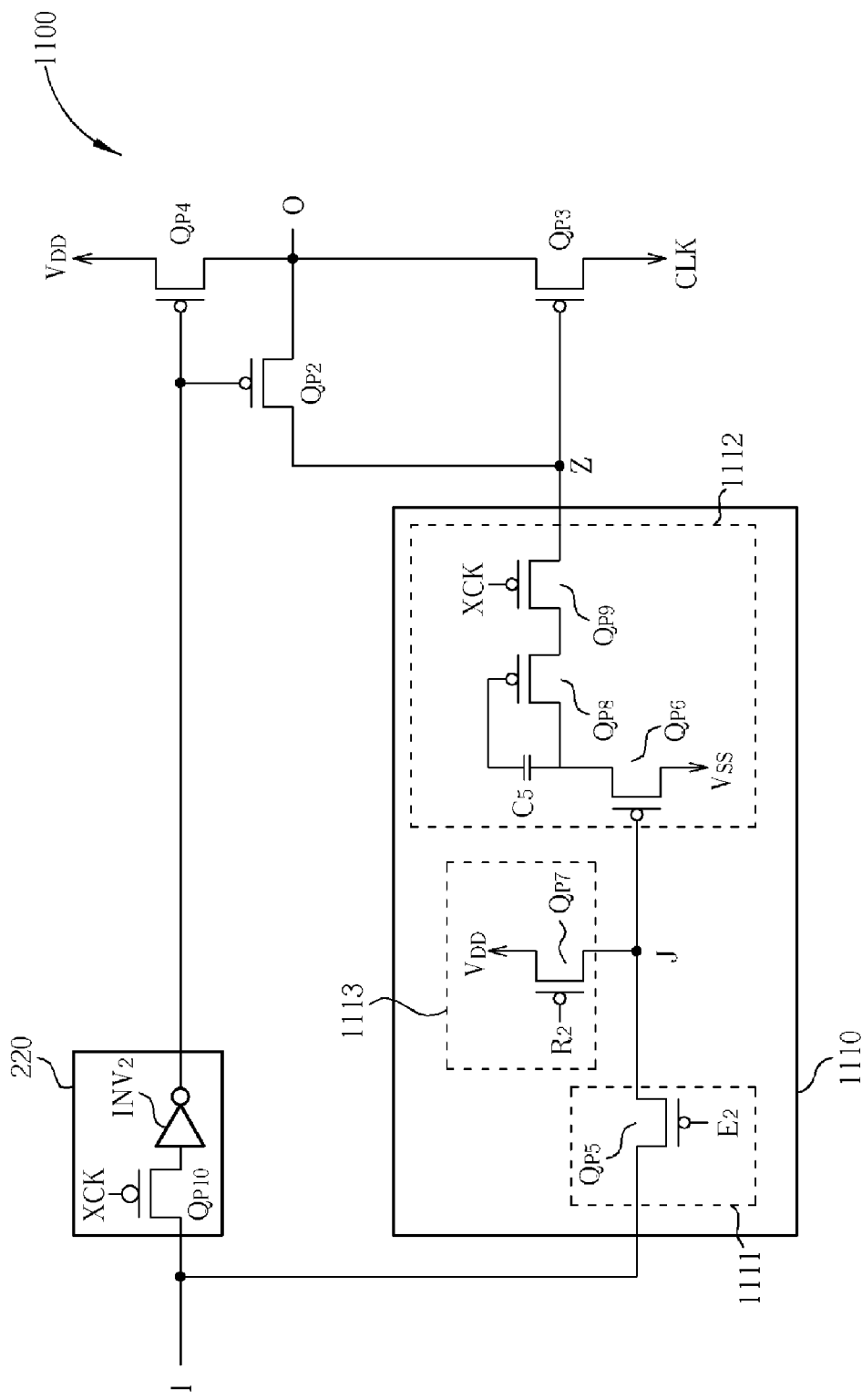
FIG. 11 is a diagram illustrating a sixth embodiment of the present invention.

FIG. 11 is a diagram illustrating a sixth embodiment of the shift register of the present invention. The shift register 1100 comprises an input end I, nodes Z and N, an output end O, a pre-charge circuit 1110, an enabling controller 220, and three switches $Q_{P2}$, $Q_{P3}$, and $Q_{P4}$. The pre-charge circuit 1110 comprises a receiving module 1111, an enabling module 1112, a reset module 1113, and a node J. The shift register 1100 is similar to the shift register 900, and the difference between the shift registers 900 and 1100 is that in the enabling module 1112 of the pre-charge circuit 1110 of the shift register 1100, a capacitor $C_5$ and two switches $Q_{P8}$ and $Q_{P9}$ are added. The capacitor $C_5$ is electrically coupled between the node J and the second end of the switch $Q_{P6}$. The control end of the switch $Q_{P8}$ is electrically coupled to the node J, the first end of the switch $Q_{P8}$ is electrically coupled to the second end of the switch $Q_{P6}$, and the second end of the switch $Q_{P8}$ is electrically coupled to the first end of the switch $Q_{P9}$. The control end of the switch $Q_{P9}$ receives the inverted signal of the clock signal CLK, which is the clock signal XCK, the first end of the switch $Q_{P9}$ is electrically coupled to the second end of the switch $Q_{P8}$, and the second end of the switch $Q_{P9}$ is electrically coupled to the node Z. The switches $Q_{P8}$ and $Q_{P9}$ are both PMOS transistors.

To sum up, the pre-charge circuit of the present invention is not affected by the fabrication process, and the shift registers employing the pre-charge circuit have high stability and high driving ability. Those skilled in the art will readily observe that numerous modifications and alterations of the device and method may be made while retaining the teachings of the invention.

What is claimed is:

1. A shift register comprising:
   an input end for receiving a first driving signal;
   an output end for outputting a second driving signal;
   an enabling controller electrically coupled to the input end of the shift register for outputting an enabling signal when receiving the first driving signal;
   wherein the enabling signal is an inverse signal of the first driving signal;
   a pre-charge circuit comprising:
      an input end electrically coupled to the input end of the shift register for receiving the first driving signal;
      an output end for outputting a pre-charge signal;
      a receiving module comprising:
         an input end electrically coupled to the input end of the pre-charge circuit for receiving the first driving signal;
         a control end for receiving a control signal; and
         an output end for transmitting the first driving signal when the receiving module receives the control signal;
      an enabling module electrically coupled between the output end of the receiving module and the output end of the pre-charge circuit for outputting the pre-charge signal when receiving the first driving signal; and
      a reset module electrically coupled between the output end of the receiving module and the enabling module for receiving a reset signal in order to reset the pre-charge signal;
   a first switch comprising:
      a first end for receiving a clock signal;
      a control end electrically coupled to the output end of the pre-charge circuit for receiving the pre-charge signal; and
      a second end electrically coupled to the output end of the shift register for coupling to the first end of the first switch when the first switch receives the pre-charge signal;
   a second switch comprising:
      a first end electrically coupled to a first voltage source;
      a control end electrically coupled to an output end of the enabling controller for receiving the enabling signal; and
      a second end electrically coupled to the output end of the shift register for coupling to the first end of the second switch when the second switch receives the enabling signal; and
   a third switch comprising:
      a first end electrically coupled to the output end of the pre-charge circuit;

a control end electrically coupled to the output end of the enabling controller for receiving the enabling signal; and a second end electrically coupled to the output end of the shift register for coupling to the first end of the third switch when the third switch receives the enabling signal.

2. The shift register of claim 1, wherein the enabling module comprises a fourth switch, the fourth switch comprising:
   a first end electrically coupled to the output end of the pre-charge circuit;
   a control end electrically coupled to the output end of the receiving module for receiving the first driving signal; and
   a second end electrically coupled to a second voltage source for coupling to the first end of the fourth switch when the fourth switch receives the first driving signal.

3. The shift register of claim 1, wherein the reset module comprises a fourth switch, the fourth switch comprising:
   a first end electrically coupled to the output end of the receiving module for receiving the first driving signal;
   a control end for receiving the reset signal; and
   a second end electrically coupled to the first voltage source for coupling to the first end of the fourth switch in order to reset the pre-charge signal when the fourth switch receives the reset signal.

4. The shift register of claim 1, wherein the receiving module further comprises fourth switch, the fourth switch comprising:
   a first end electrically coupled to the output end of the receiving module;
   a control end electrically coupled to the control end of the receiving module for receiving the control signal; and
   a second end electrically coupled to the input end of the receiving module for coupling to the first end of the fourth switch when the fourth switch receives the control signal.

5. The shift register of claim 1, wherein the control signal is the first driving signal or an inverse signal of the clock signal.

6. The shift register of claim 1, wherein the reset signal is an inverse signal of the clock signal or the second driving signal.

7. The shift register of claim 1, wherein the enabling controller comprises:
   a fourth switch comprising:
      a first end electrically coupled to the input end of the shift register;
      a control end for receiving an inverse signal of the clock signal; and
      a second end for electrically coupling to the first end of the fourth switch when the fourth switch receives the control signal; and
   an inverter comprising:
      an input end electrically coupled to the second end of the fourth switch; and
      an output end electrically coupled to the control end of the second switch.

* * * * *